United States Patent [19]
Kitano et al.

[11] Patent Number: 6,059,880
[45] Date of Patent: *May 9, 2000

[54] COATING APPARATUS

[75] Inventors: Takahiro Kitano, Kumamoto; Katsuya Okumura; Shinichi Ito, both of Yokohama, all of Japan

[73] Assignees: Tokyo Electron Limited, Tokyo; Kabushiki Kaisha Toshiba, Kawasaki, both of Japan

[*] Notice: This patent is subject to a terminal disclaimer.

[21] Appl. No.: 08/995,990

[22] Filed: Dec. 22, 1997

[30] Foreign Application Priority Data

Dec. 25, 1996 [JP] Japan .................................. 8-346077
Oct. 2, 1997 [JP] Japan .................................. 9-270126

[51] Int. Cl.$^7$ .................................................. B05C 5/00
[52] U.S. Cl. ........................... 118/52; 118/612; 118/319; 118/320; 366/160.2; 366/152.1; 239/304; 239/310; 239/410; 239/413; 137/88; 137/606; 137/897; 137/898
[58] Field of Search ........................ 239/407, 410, 239/413, 304, 310; 366/160.1, 160.2, 160.3, 160.4, 152.1, 152.2, 341; 118/600, 612, 52, 319, 320; 137/88, 896, 897, 898, 605, 606; 251/149, 149.1

[56] References Cited

U.S. PATENT DOCUMENTS

| | | | |
|---|---|---|---|
| 3,806,037 | 4/1974 | Loewenkamp | 239/407 |
| 5,254,367 | 10/1993 | Matsumura et al. | |
| 5,464,283 | 11/1995 | Davis | 366/152.1 |
| 5,478,435 | 12/1995 | Murphy et al. | |
| 5,652,919 | 7/1997 | Itoh | |
| 5,658,615 | 8/1997 | Hasebe et al. | |

*Primary Examiner*—Laura Edwards
*Attorney, Agent, or Firm*—Oblon, Spivak, McClelland, Maier & Neustadt, P.C.

[57] ABSTRACT

A coating apparatus according to the invention comprises a spin chuck for holding a substrate, resist solution tanks which contain a primary resist solution, a thinner tank which contains thinner, a confluence valve communicating with the thinner tank and the resist solution tanks, first pumps each for supplying the confluence valve with the primary resist solution from a corresponding one of the resist solution tanks, a second pump for supplying thinner from the thinner tank to the confluence valve, a mixer for mixing the primary treatment solution and thinner supplied from the confluence valve, a nozzle for applying a solution from the mixer, to the substrate held by the spin chuck, and a controller for controlling the first and second pumps to adjust the mixture ratio of the primary resist solution to be supplied from each of the resist solution tanks to the confluence valve, to thinner to be supplied from the thinner tank to the confluence valve.

16 Claims, 13 Drawing Sheets

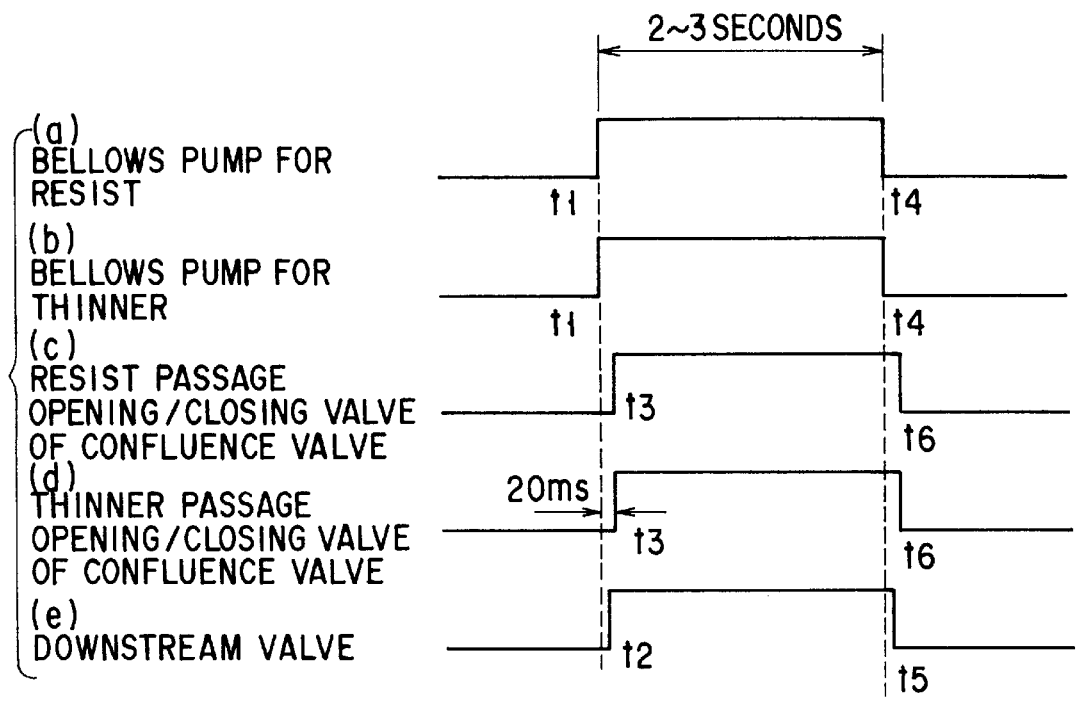
FIG. 9
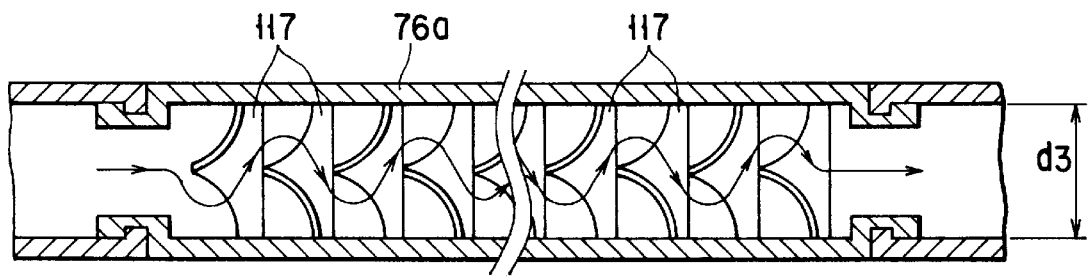
FIG. 10
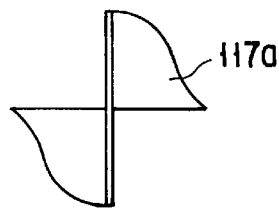 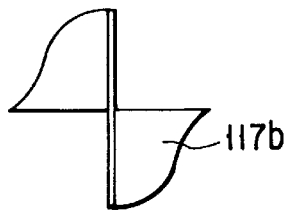
FIG. 11A      FIG. 11B

COATING APPARATUS

BACKGROUND OF THE INVENTION

This invention relates to a coating apparatus for applying a liquid agent such as a resist solution, to a substrate such as a semiconductor wafer or an LCD substrate.

The photolithography technique is used in a process for manufacturing semiconductor devices. In the photolithography, a resist is coated on a semiconductor wafer, then exposed to have a predetermined pattern, and developed. As a result, a resist film of a predetermined pattern is formed on the wafer. This resist film is subjected to a further film-forming treatment and an etching treatment, thereby forming a circuit of a predetermined pattern. A series of resist coating treatments as above are performed by a coating/developing apparatus as described in U.S. Pat. No. 5,664,254.

Uniformity in the thickness of a resist film and a reduction in the thickness are now being strongly demanded to meet a recent tendency to reduce a line width, employed in semiconductor devices, to a submicron value. At present, a spin coating method is mainly used to coat a wafer with a resist. In this method, the thickness of a resist film is controlled by adjusting the rotational speed of the wafer. In order to, for example, thin the resist film, the wafer must be rotated at a high speed.

In the conventional resist coating apparatus, however, the mechanical performance of the spin chuck is limited, and hence the wafer rotational speed has an upper limit. As a result, the thickness of the resist film cannot be reduced to less than a certain value. In particular, in the case of coating a large-diameter wafer of eight inches or twelve inches, the speed of diffusion or spread of a resist solution on the wafer is low, which makes it difficult to form a thinner resist film than ever.

Moreover, immediately after changes in process conditions such as a required film thickness, the kind of resist solution, etc., a resist film coated on a first wafer may well have a thickness which is not equal to a target value. In this case, the coated resist must be removed from the wafer, and resist coating performed again.

BRIEF SUMMARY OF THE INVENTION

It is an object of the invention to provide a compact coating apparatus of a simple structure capable of thinning a resist film more than ever with a desired film thickness maintained.

It is another object of the invention to provide a coating apparatus capable of performing desired liquid agent coating even immediately after the required resist film thickness, the kind of resist solution, etc. are changed.

To deal with a demand for still thinner resist films, a resist solution which can easily be diffused on a wafer is employed. The viscosity of the resist solution is determined in consideration of, for example, the amount of a solvent, such as thinner, to be mixed therewith. The resist solution with the thus-determined viscosity is contained in a tank, and put into use. As a result, the resist film thickness can be varied within a wider range than ever.

Actually, however, the resist solution and thinner have no compatibility, and are inevitably separated into layers in the tank. Therefore, a relatively large agitator is necessary to agitate them. This is one of the causes which make it difficult to reduce the size of the resist film coating apparatus.

Moreover, each time the required resist film thickness is changed, the resist solution must be exchanged in units of a tank. Further, to meet a request for changing the resist film thickness, many tanks which contain various kinds of resist solutions must be prepared beforehand. To manage many tanks requires a great amount of labor. In addition, even when a resist solution of a predetermined viscosity is used, resist films of the same thickness cannot necessarily be formed if the daily ambient conditions differ. Therefore, when the ambient conditions differ, it is desirable to use a resist solution with a slightly different viscosity. However, a tank which contains a resist solution of an appropriate viscosity may not always be prepared.

As described above, in the conventional resist coating apparatus, the resist solution must be exchanged in units of a tank each time the required resist film thickness is changed. Further, to meet a request for changing the resist film thickness, many tanks which contain various kinds of resist solutions must be prepared beforehand. Also, it is difficult to appropriately deal with the slight change in film thickness which depends upon the daily ambient conditions.

A coating apparatus according to the invention is characterized by comprising: a substrate holding member for holding the substrate; a treatment solution supply which contains a primary treatment solution mixed with a solvent; a solvent supply which contains a solvent;

a confluence valve communicating with the solvent supply and the treatment solution supply; first pump means for supplying the primary treatment solution from the treatment solution supply to the confluence valve; second pump means for supplying the solvent from the solvent supply to the confluence valve; a mixer provided downstream of the confluence valve for mixing the primary treatment solution and the solvent supplied from the confluence valve; nozzle means having a solution discharge portion for applying a solution from the mixer, to the substrate held by the substrate holding member; and control means for controlling the first and second pump means to adjust a mixture ratio of the primary treatment solution to be supplied from the treatment solution supply to the confluence valve, to the solvent supplied from the solvent supply to the confluence valve.

Since in the above coating apparatus, the viscosity of the treatment solution is adjusted immediately before it is applied to the substrate, the treatment solution can be sufficiently mixed with the solvent (and hence the resultant solution has a uniform viscosity) even when they are made of materials which are liable to separate from each other. As a result, a film of a uniform and accurate thickness can be obtained. Further, a request for changing a film thickness can be dealt with quickly. Also, it is not necessary to beforehand prepare treatment solutions of different viscosities, which enables the apparatus to be made compact. Furthermore, slight variations in film thickness due to differences in daily ambient conditions can be dealt with easily.

Preferably, the nozzle means includes a discharge valve located upstream of the mixer and in the vicinity of the solution discharge portion for permitting or interrupting the flow of the solution from the mixer.

More preferably, the treatment solution supply has a plurality of treatment solution tanks which contain primary treatment solutions of different compositions; the solvent supply has a single solvent tank which contains the solvent; and the confluence valve includes switch means for switching the treatment solution tanks from one to another to switch, from one to another, the primary treatment solutions to be supplied to the mixer, a solvent passage communicating with the solvent tank, a valve seat provided in the solvent passage, a first valve body for opening and closing the solvent passage, and a first cylinder for bringing the first valve body into and out of contact with the valve seat.

Using the switch means constructed as above enables the kind of to-be-coated treatment solution to be changed easily, and also enables the selected kind of treatment solution to be adjusted to an appropriate viscosity immediately before the solution is applied.

Preferably, the switch means includes a plurality of treatment solution passages each communicating with a corresponding one of the treatment solution tanks, valve seats each provided in a corresponding one of the treatment solution passages, second valve bodies each for opening and closing a corresponding one of the solution treatment passages, and second cylinders each for bringing a corresponding one of the second valve bodies into and out of contact with a corresponding one of the valve seats.

The control means may individually control the supply rate of the primary treatment solution from the treatment solution supply, and the supply rate of the solvent from the solvent supply. This can promptly deal with a request for changing the thickness of a film to be coated on a substrate. Further, since in this case, it is not necessary to beforehand prepare treatment solutions of different viscosities, the apparatus can to be made compact. Furthermore, slight variations in film thickness due to differences in daily ambient conditions can be dealt with easily.

It is desirable that the first and second pump means each include a flexible tube which communicates with a solution reservoir, and a third cylinder for reciprocating the flexible tube. It is also desirable that the apparatus further comprises a sensor for sensing the amount of displacement of the flexible tube, and the control means controls the third cylinder of each of the first and second pump means on the basis of a detection signal from the sensor.

Moreover, it is preferable that the control means controls the third cylinders of the first and second pump means to simultaneously operate at a time point t1, and to simultaneously stop at a time point t4, and controls the solvent passage and one of the treatment solution passages of the confluence valve to simultaneously open at a time point t3 slightly later than the time point t1 and to simultaneously close at a time point t6 slightly later than the time point t4. This structure can effectively prevent reverse flow of the primary treatment solution from the mixer to the confluence valve.

Further preferably, the apparatus further comprises remaining solution exhausting means for exhausting a solution remaining between the confluence valve and the solution discharge portion before switching the treatment solution tanks, after the switch means switches the treatment solution tanks. This structure can prevent the primary treatment solution applied before the change in the kind of treatment solution from being again applied to the substrate, which means that a desired kind of treatment solution can be coated on a substrate which is first fed after the change of the kind of treatment solution.

Also preferably, the apparatus further comprises remaining solution exhausting means for exhausting a solution remaining between the confluence valve and the solution discharge portion before changing the mixture ratio of the primary treatment solution to the solvent, after the control means changes the mixture ratio. This structure can prevent the primary treatment solution applied before the change in the viscosity of the treatment solution from being again applied to the substrate, which means that a desired kind of treatment solution can be coated on a substrate which is first fed after the change in the viscosity of the treatment solution.

It is desirable that the mixer is a static mixer having a plurality of baffles linearly arranged across a solution passage for mixing the primary treatment solution and the solvent. Moreover, it is desirable that each of the baffles of the static mixer is formed by leftward or rightward twisting one side of a square plate by 90°, and leftward twisted baffles and rightward twisted baffles are arranged alternately in the solution passage. In this case, it suffices if the mixer has an inner diameter substantially identical to that of a usual tube. Accordingly, the mixer can be made compact. This means that the amount of the remaining solution to be exhausted when the coating conditions are changed can be reduced, thereby reducing the amount of the used treatment solution and solvent.

It is important to situate the static mixer such that its downstream end is higher than its upstream end. Otherwise, the multiple baffles arranged in the mixer interrupt the flow of air and cause the air to form a mass, thereby adversely affecting the mixing of the treatment solution and the solvent. To avoid this, the mixer is situated obliquely or stood straight with the downstream end kept high. In this structure, air having entered the mixer through the upstream end moves upward to its downstream side and goes out of it. Thus, predetermined capability of mixing can be maintained. Specifically, it is desirable that the solution passage of the mixer is inclined by 20° or more with respect to a horizontal plane.

In addition, it is preferable that the apparatus further comprises a main air valve for adjusting flow or pressure of air to be supplied to the first, second and third cylinders, and that the main air valve is controlled by the control means.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 9 is a timing chart (a) to (e), showing the operations of bellows pumps and valves incorporated in a resist solution supply circuit;

FIG. 10 is a sectional view, showing the interior of a static mixer;

FIGS. 11A and 11B are views, each showing a baffle incorporated in the static mixer;

DETAILED DESCRIPTION OF THE INVENTION

Preferred embodiments of the invention will be described with reference to the accompanying drawings.

Figure 1:
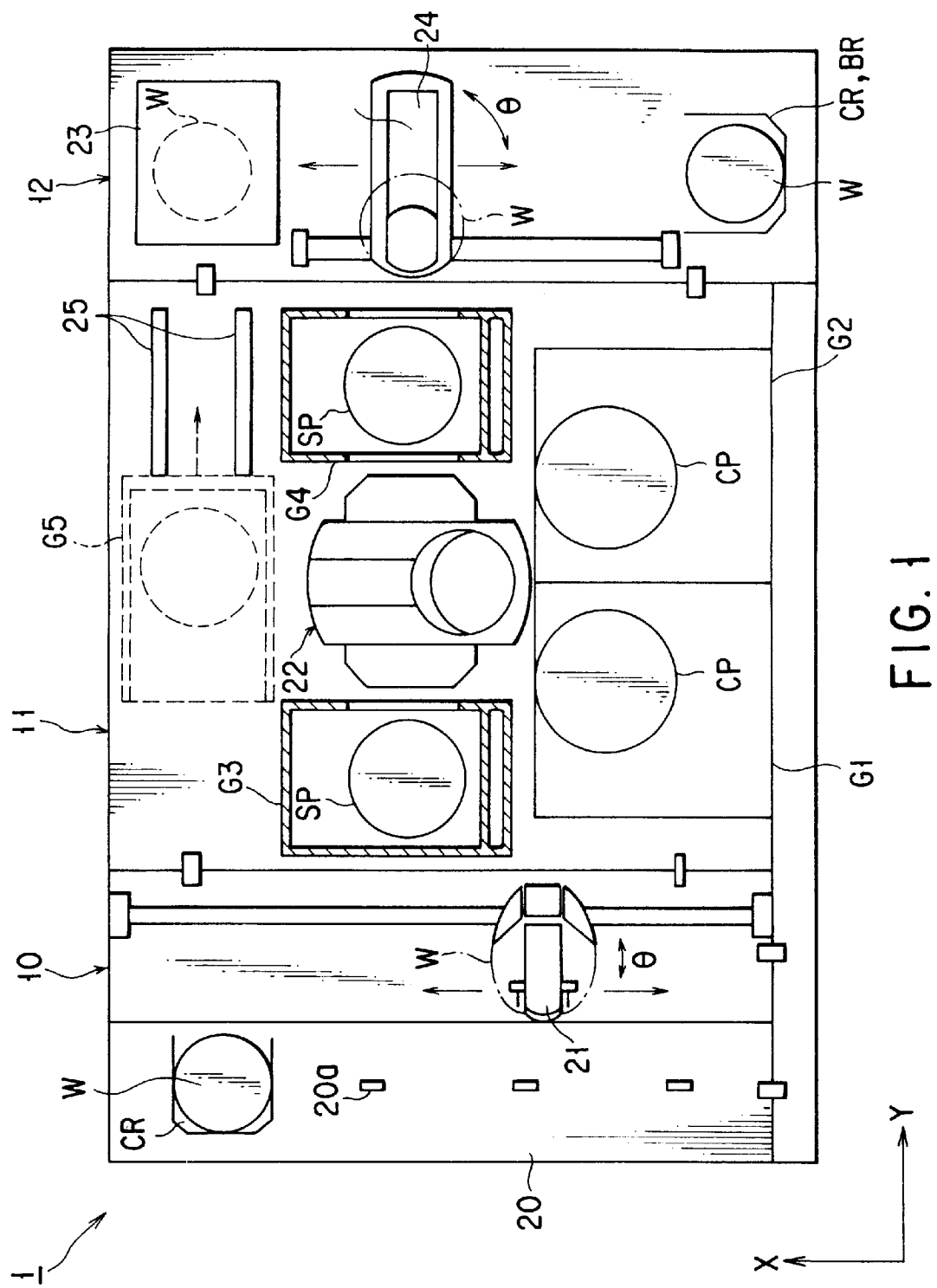
FIG. 1 is a plan view, showing a resist coating/developing system.

As is shown in FIG. 1, a coating/developing system 1 comprises a cassette section 10, a process section 11, and an interface section 12. An exposure unit (not shown) is located adjacent to the interface section 12.

The cassette section 10 includes a mounting table 20 provided with four positioning projections 20a for positioning cassettes CR. The cassettes CR are placed on the mounting table 20 in the X-axis direction. In each cassette CR, twenty five wafers W are stacked at regular intervals, usually. A first sub arm mechanism 21 is provided such that it can move on the table 20 in its longitudinal direction. The first sub arm mechanism 21 has a holder for holding each wafer W, a horizontally driving mechanism (not shown) for moving the holder in the X-axis direction, a vertically driving mechanism (not shown) for moving the holder in the Z-axis direction, and a θ rotation mechanism (not shown) for rotating the holder about the Z-axis. Behind the first sub arm mechanism 21, a third process unit group $G_3$ included in the process section 11 is located, whereby the first sub arm mechanism 21 can access an alignment unit (ALIM) and an extension unit (EXT) included in the third process unit group $G_3$.

The process section 11 includes five process unit groups $G_1$–$G_5$ and a main arm mechanism 22. Each process unit group has units stacked on each other for applying a resist to a wafer W. The arm mechanism 22 is surrounded with the unit groups.

Figure 3:
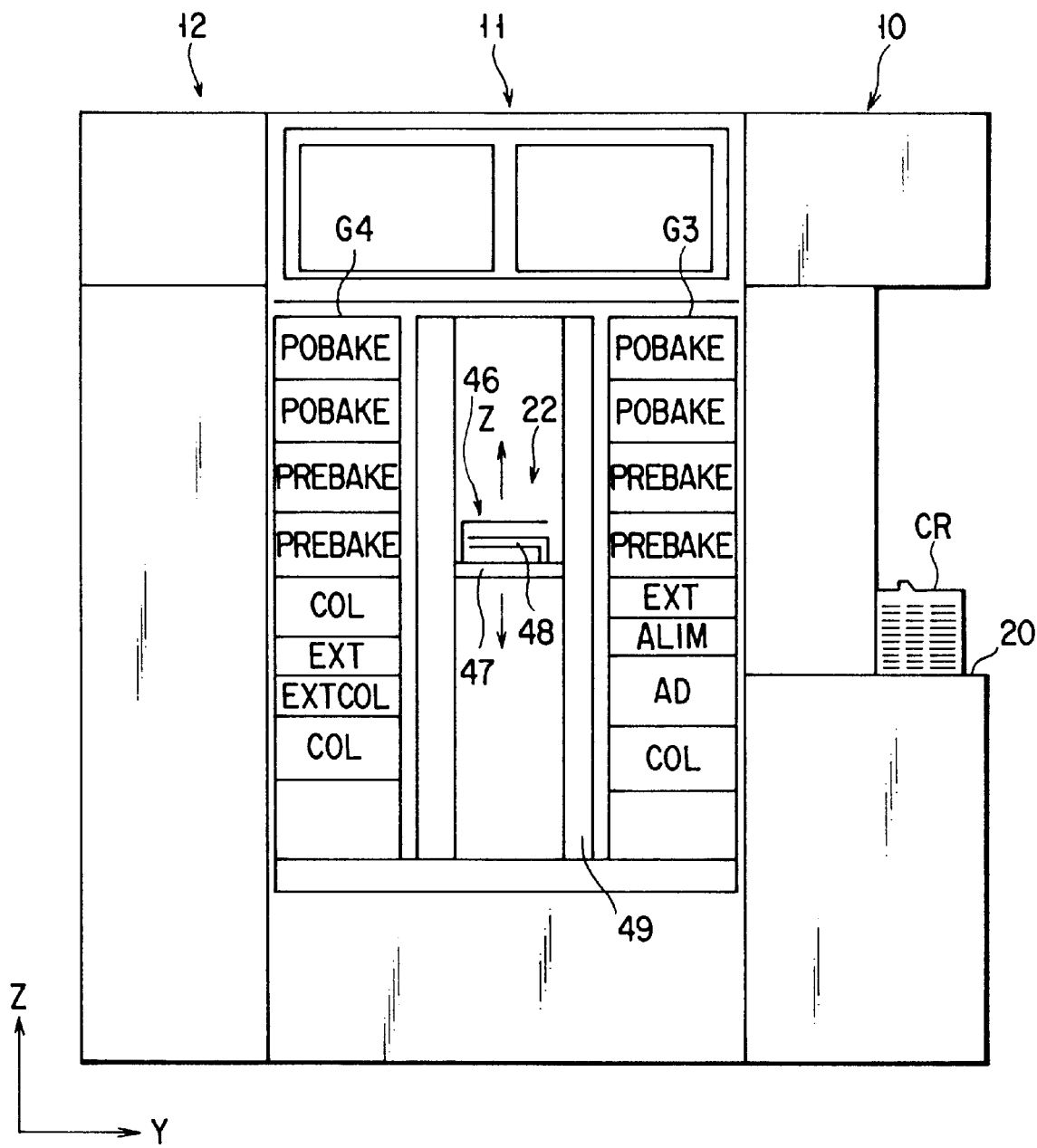
FIG. 3 is a rear view, showing the resist coating/developing system.

As is shown in FIG. 3, the main arm mechanism 22 has a cylindrical support member 49 extending in the Z-axis direction, and a wafer transfer unit 46 located inside the cylindrical support member 49. A lower portion of the cylindrical support member 49 is coupled with the axis-of-rotation of a motor (not shown), and the wafer transfer unit 46 is disposed to rotate about the Z-axis, together with the cylindrical support member 49.

The wafer transfer unit 46 includes a Z-axis driving mechanism (not shown), a transfer table 47 and a plurality of arm holders 48. The wafer transfer unit 46 is vertically moved within the cylindrical support member 49 by the Z-axis driving mechanism. Each arm holder 48 is supported by an advancing/retreating mechanism (not shown) such that it can advance and retreat on the transfer table 47.

Figure 2:
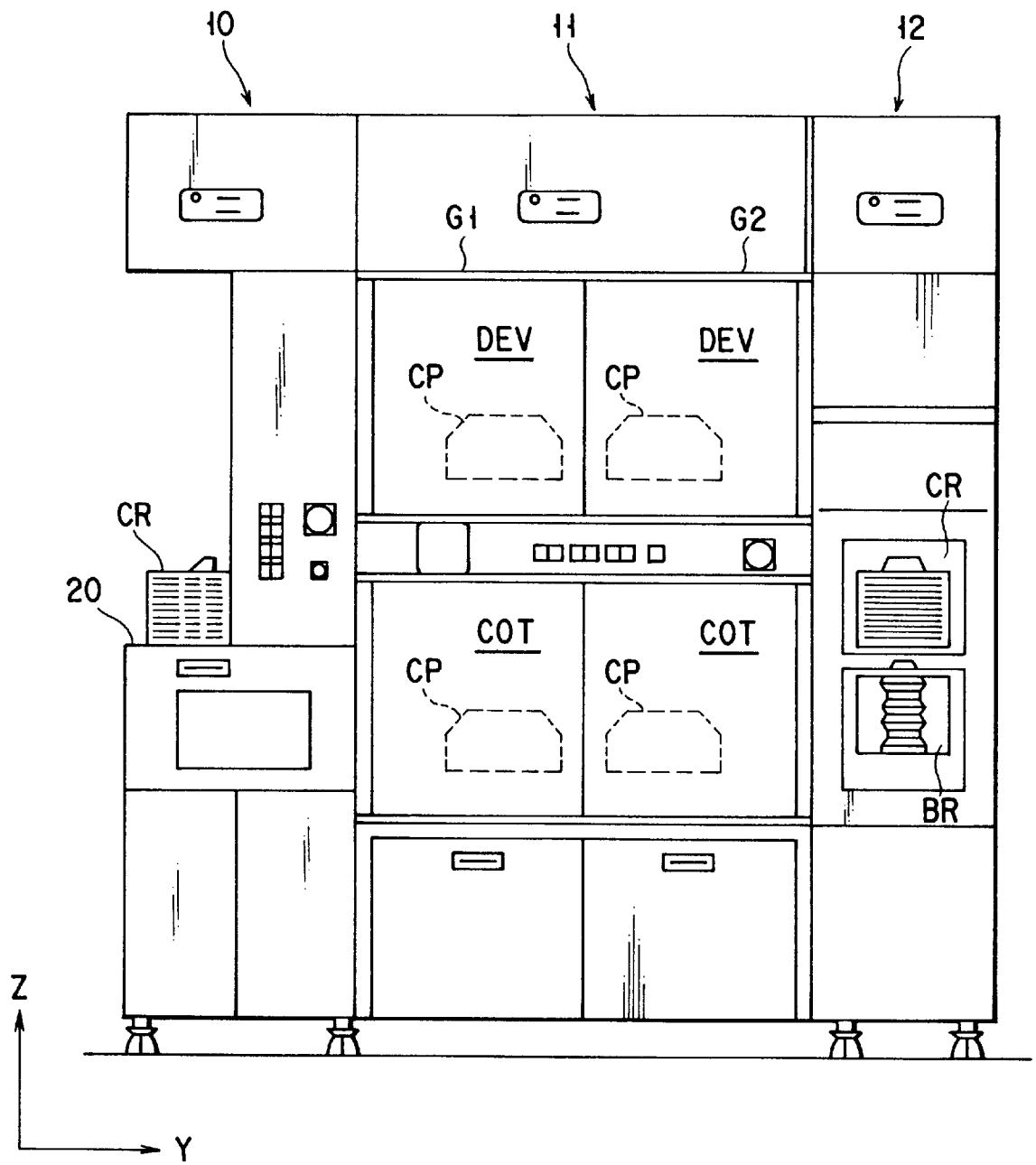
FIG. 2 is a front view, showing the resist coating/developing system.

As is shown in FIG. 2, the first and second process unit groups $G_1$ and $G_2$ are located adjacent to each other at a front portion of the system 1. As is shown in FIG. 3, the third process unit group $G_3$ is located adjacent to the cassette section 10, and the fourth process unit group $G_4$ adjacent to the interface section 12. Further, as is shown in FIG. 1, the fifth process unit group $G_5$ may be additionally provided at a rear portion of the system.

As is shown in FIG. 2, the first process unit group $G_1$ has a resist coating unit (COT) and a developing unit (DEV) stacked on the resist coating unit. Thus, it is preferable to locate the resist coating unit (COT) at a lower portion of the system 1 in order to simplify the structure of a drain treating mechanism and to facilitate the maintenance working. Each unit (COT, DEV) contains a cup CP and a spinner process device with a spin chuck. Similarly, the second process unit group $G_2$ has a resist coating unit (COT) and a developing unit (DEV) stacked on the resist coating unit. The resist coating units (COT) of the first and second process unit groups $G_1$ and $G_2$ are located adjacent to each other, while the developing units (DEV) of the first and second process unit groups $G_1$ and $G_2$ are located adjacent to each other.

As is shown in FIG. 3, the third process unit group $G_3$ includes a cooling unit (COL) for cooling a wafer W placed on a mount table SP, an adhesion unit (AD) for imparting hydrophobic nature to the resist to enhance its adhesion, an alignment unit (ALIM) for aligning the wafer W, an extension unit (EXT) for permitting the wafer W to stand by, two pre-baking units (PREBAKE) for performing a heat treatment before an exposure treatment, and two post-baking units (POBAKE) for performing a heat treatment after the exposure treatment. These eight units are stacked on each other in this order. Similarly, the fourth process unit group $G_4$ includes a cooling unit (COL), an extension cooling unit (EXTCOL), an extension unit (EXT), a cooling unit (COL), two pre-baking units (PREBAKE), and two post-baking units (POBAKE).

As described above, the cooling unit (COL) and the extension cooling unit (EXTCOL), which employ lower treatment temperatures, are located in lower positions, while the pre-baking unit (PREBAKE) and the post-baking unit (POBAKE), which employ higher treatment temperatures, are located in upper positions. As a result, thermal interference between the units can be minimized.

The interface section 12 has substantially the same X-axis directional dimension as the process section 11, and a smaller Y-axis directional dimension than it. A movable pick-up cassette CR and a stationary buffer cassette BR are stacked on each other at a front portion of the interface section 12. Further, a peripheral exposure unit 23 is provided at a rear portion of the interface section 12. Moreover, the interface section 12 includes a second sub arm mechanism 24, which has an X-axis driving mechanism (not shown), a Z-axis driving mechanism (not shown) and a θ rotation mechanism (not shown). The second sub arm mechanism 24 is accessible to each cassette CR, BR, the peripheral exposure unit 23, the extension unit (EXT) which is included in the fourth process unit group $G_4$, and a wafer transfer table (not shown) located on the exposure unit side.

In the coating/developing system 1, the fifth process unit group $G_5$ can be added behind the main arm mechanism 22. This process unit group $G_5$ is slidable along a guide rail 25 in the Y-axis direction. Where it is shifted in the Y-axis direction, a space will be defined at the rear side of the main arm mechanism 22, through which space the mechanism 22 can be inspected or repaired easily.

Figure 4:
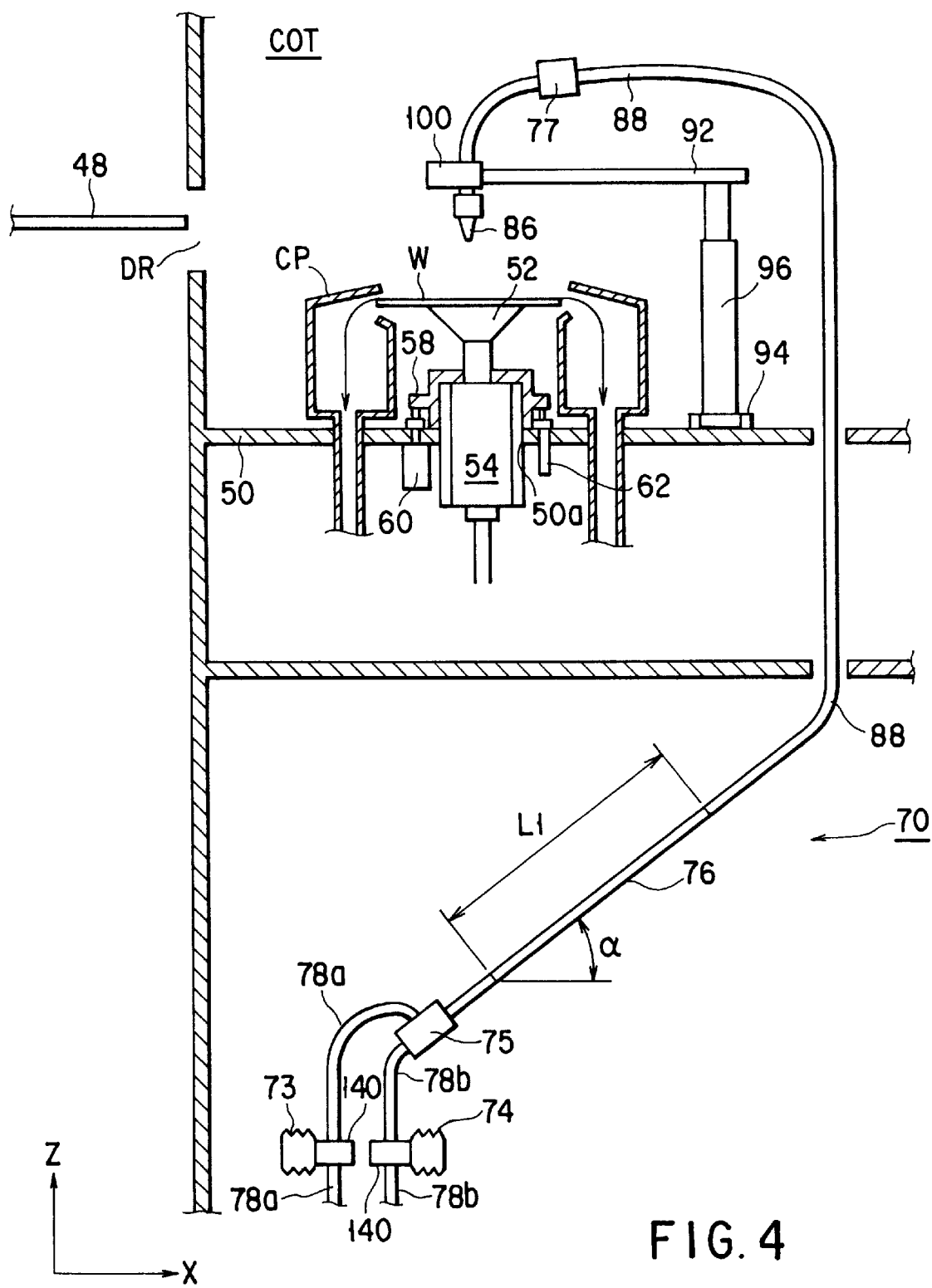
FIG. 4 is a sectional view, showing the overall structure of a coating apparatus according to an embodiment of the invention.
Figure 5:
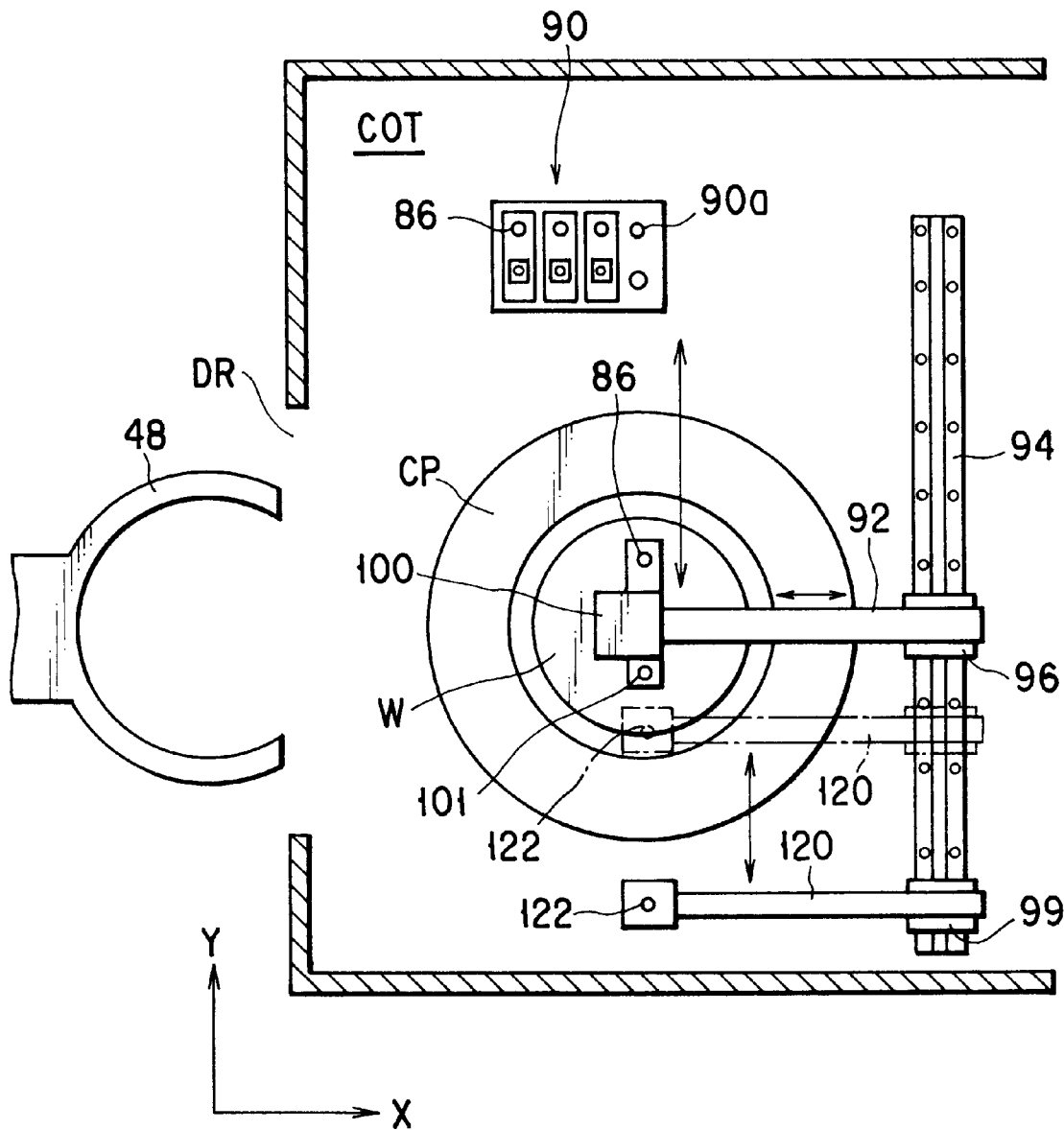
FIG. 5 is a plan view, showing the overall structure of the coating apparatus.

Referring then to FIGS. 4 and 5, each resist coating unit (COT) will be described.

An annular cup CP is provided at a center portion of each resist coating unit (COT), and a spin chuck 52 is provided at a center portion of the annular cup CP. A plurality of suction holes (not shown) are formed in the upper surface of the spin chuck 52, thereby enabling a wafer W to be held on the spin chuck 52 by a vacuum force. A lower portion of the spin chuck 52 is coupled with the driving shaft of the motor 54.

The body of the motor 54 is inserted through an opening 50a formed in a unit bottom plate 50. An aluminum flange cap 58 covers an upper portion of the motor 54. Through the flange cap 58, the motor 54 is coupled with an air cylinder 60 and a vertically movable guide 62. Power supply circuits for the motor 54 and the cylinder 60 are connected to the output side of a controller 131 shown in FIG. 12.

At the time of resist coating, the lower end of the flange cap 58 is in tight contact with the unit bottom plate 50 around the opening 50a, thereby sealing the resist coating unit (COT) in an airtight manner. As is shown in FIG. 5, a carry-in/carry-out port DR is provided in one side surface of the resist coating unit (COT), through which the wafer W is carried into and out of the unit (COT) by the arm holder 48 of the main arm mechanism 22. At the time of transfer of the wafer W, a rod is protruded from the cylinder 60 to raise the spin chuck 52, lift pins (not shown) are protruded from the spin chuck 52 to raise the wafer W, the arm holder 48 of the main arm mechanism 22 is inserted under the raised wafer W, and the lift pins are lowered. Thus, the wafer W is transferred onto the arm holder 48.

The cup CP surrounds the spin chuck 52 and hence the wafer W thereon. A lower portion of the cup CP communicates with a drain passage, through which a drain centrifuged from the wafer W during its rotation is exhausted to the outside of the unit(COT). The annular cup CP is covered with an openable/closable lid (not shown).

A resist nozzle 86 is detachably attached to a free end of a scan arm 92 by means of a holder 100. The proximal end of the scan arm 92 is horizontally supported by a first nozzle operating mechanism 96. The first operating mechanism 96 has an X-axis driving mechanism, a Y-axis driving mechanism and a Z-axis driving mechanism (which are not shown). A Y-axis guide rail 94 is provided on the unit bottom plate 50. The nozzle operating mechanism 96 is moved by the Y-axis driving mechanism along the guide rail 94 in the Y-axis direction. Further, the nozzle 86 is vertically moved by the Z-axis driving mechanism, together with the scan arm 92, and is moved by the X-axis driving mechanism in the X-axis direction.

Figure 13:
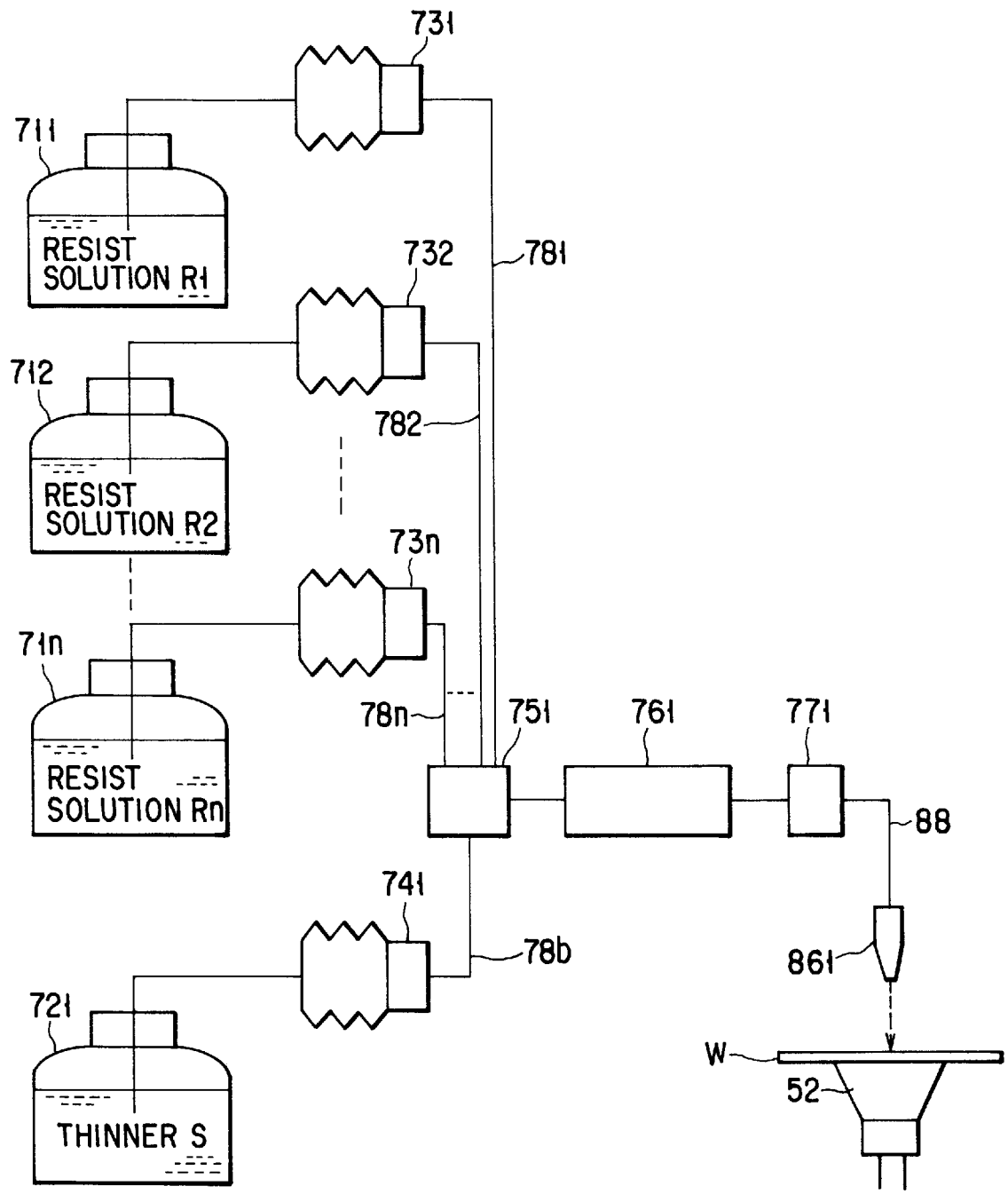
FIG. 13 is a view, showing a resist/thinner mixer incorporated in a coating apparatus according to another embodiment of the invention.

As is shown in FIG. 5, a nozzle stand-by section 90 is provided adjacent to the cup CP in the unit (COT). The nozzle stand-by section 90 is where a plurality of resist nozzles 86 as described above stand by and have their discharge ports inserted in holes 90a which are formed in a solvent atmosphere chamber. These nozzles 86 are used to discharge resist solutions of different kinds and viscosities, and respectively connected to resist solution supply sources 71l–71n (see FIG. 13) for supplying the resist solutions.

The holder 100 attached to the free end of the scan arm 92 is used to pick up one of the resist nozzles 86 from the nozzle stand-by section 90. The holder 100 is also attached to a thinner nozzle 101, which is provided for applying thinner to the wafer before the application of the resist solution. In other words, the thinner nozzle 101 performs so-called "pre-wet" coating.

A second nozzle operating mechanism 99, which has a similar structure to that of the first nozzle operating mechanism 96, can also move along the guide rail 94. The second nozzle operating mechanism 99 supports the proximal end of a horizontal scan arm 120. A rinse nozzle 122 for side rinsing is attached to the free end of the horizontal scan arm 120.

As is shown in FIG. 4, each of the resist nozzles 86 is connected, via a corresponding resist solution supply tube 88, to a corresponding resist/thinner mixer 70 located in a chamber below the resist coating unit (COT).

Referring then to FIGS. 6–10, the resist/thinner mixer 70 will be described in detail.

Figure 6:
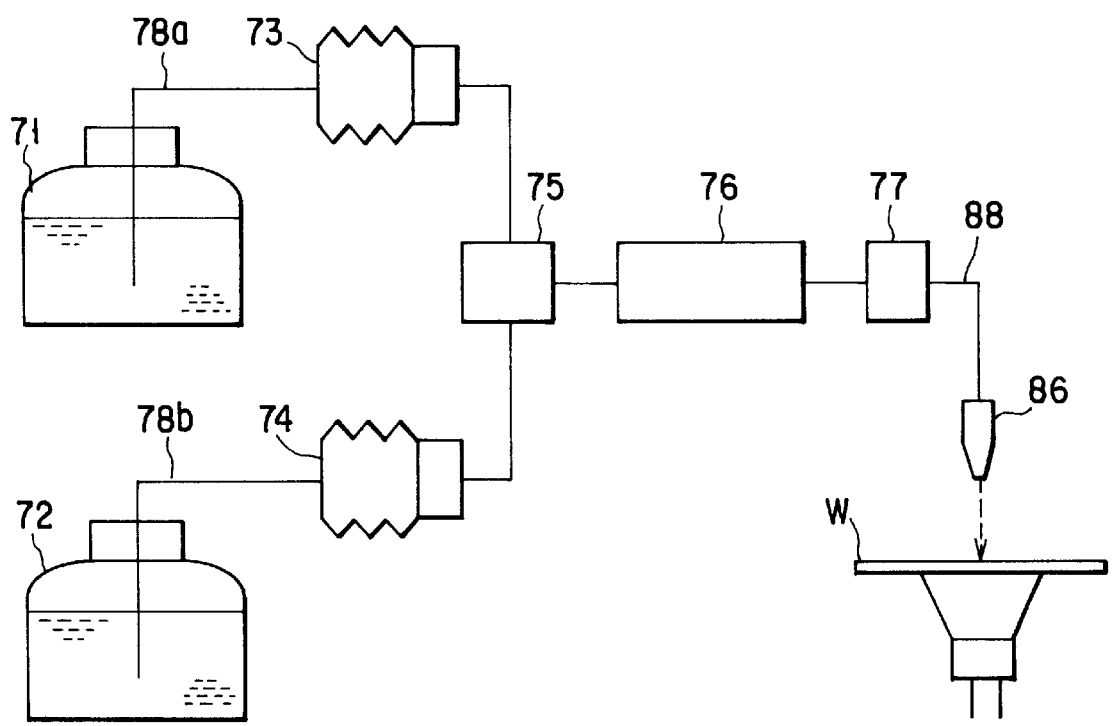
FIG. 6 is a view, showing a resist/thinner mixer incorporated in the coating apparatus.

As is shown in FIG. 6, each resist/thinner mixer 70 comprises a resist tank 71 which contains a resist solution, a thinner tank 71 which contains thinner as a solvent, a confluence valve 75 for simultaneously opening and closing the passes of the resist solution and thinner to make them confluent, a resist bellows pump 73 for pumping the resist solution contained in the tank 71 and introducing it into the confluence valve 75, a solvent bellows pump 74 for pumping thinner contained in the thinner tank 72 and introducing it into the confluence valve 75, a static mixer 76 for mixing the resist solution and thinner having passed the confluence valve 75, and a valve 77 connecting the static mixer 76 to the resist nozzle 86 via the resist supply tube 88. The above elements are connected to each other by means of, for example, a teflon tube which has a high corrosion resistance.

The resist tank 71 and the thinner tank 72 are located outside the body of the coating/developing system 1, and respectively connected to the resist solution bellows pump 73 and the solvent bellows pump 74 via tubes 78a and 78b which extend from the interior to the exterior of the system 1.

Figure 7A:
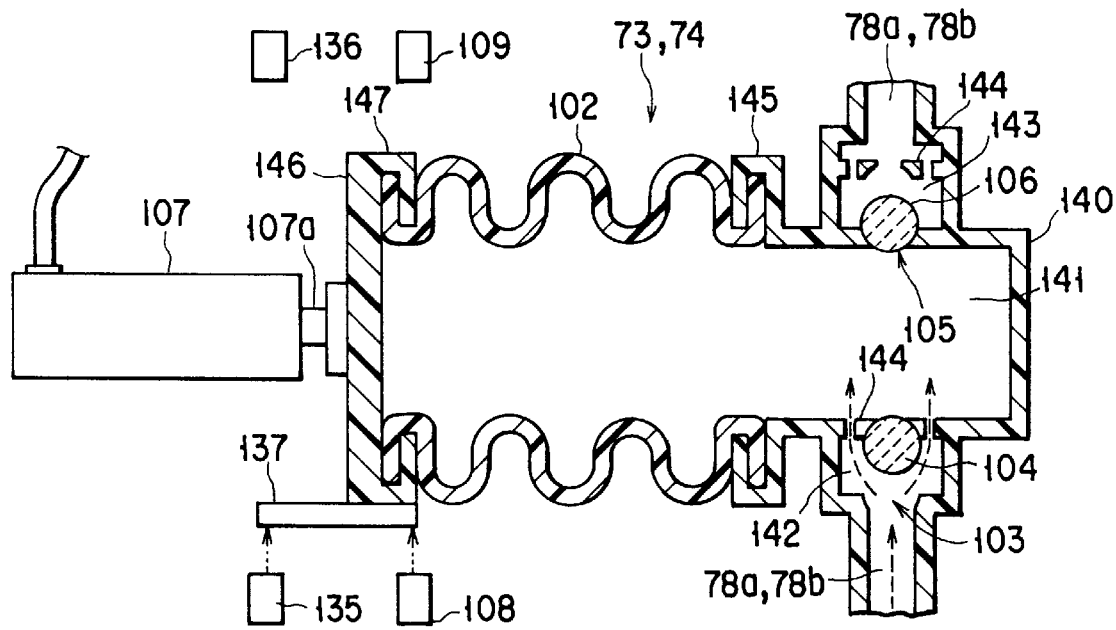
FIGS. 7A and 7B are sectional views, each showing a bellows pump in detail.
Figure 7B:
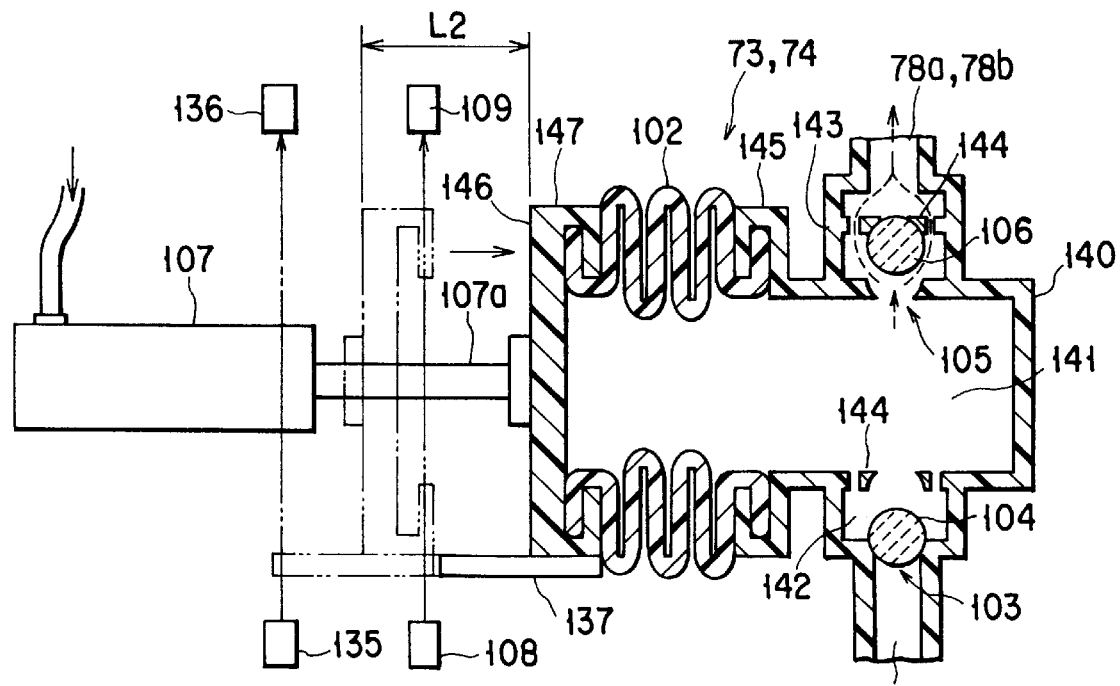

Referring now to FIGS. 7A and 7B, the bellows pumps will be described. Since the bellows pumps 73 and 74 have the same structure, only the bellows pump 73 will be described.

The bellows pump has a flexible tube 102, an air cylinder 107 with a rod 107a and a solution feeder 140 with a flange 145. The flexible tube 102 is an expandable/contractible bellows made of a soft resin. The flexible tube 102 has one end thereof coupled with the flange 145 of the solution feeder 140, and the other end coupled with the flange 147 of a blind patch 146.

The rod 107a of the air cylinder 107 is coupled with the back surface of the blind patch 146. The air cylinder 107 communicates with a compressed air supply (not shown) controlled by the controller 131. A shielding plate 137 is attached to an outer surface of the blind patch 146.

Two pairs of sensors (108, 109), (135, 136) are provided in the vicinity of the flexible tube 102 for sensing displacement of the tube. When the rod 107a is retreated into the cylinder 107, thereby expanding the flexible tube 102, detection light beams from the light emitting sections 108 and 135 of the first and second sensors are shielded by the shielding plate 137 (see FIG. 7A). When, on the other hand, the rod 107a is protruded from the cylinder 107, thereby contracting the flexible tube 102, the detection light beams from the light emitting sections 108 and 135 of the first and second sensors reach the light receiving sections 109 and 136, respectively (see FIG. 7B). The controller 131 controls the on/off operation of the cylinder 107 on the basis of detection results from both sensors (108, 109), (135, 136), thereby causing each bellows pump 73, 74 to feed an appropriate amount of solution.

The solution feeder 140 includes a solution reservoir 141 and a pair of ball valves 142 and 143. The ball valve 142 is located upstream of the solution reservoir 141, while the ball valve 143 is located downstream of it. The upstream ball valve 142 has a hard ball 104 made of, for example, ceramic, and a stopper 144. Similarly, the downstream ball valve 143 has a hard ball 105 made of, for example, ceramic, and a stopper 144.

When the flexible tube 102 is expanded, the upstream ball valve 142 opens, the solution is introduced into the solution reservoir 141, as is shown in FIG. 7A. On the other hand, when the flexible tube 102 is contracted, the downstream ball valve 143 opens, the solution is pushed from the solution reservoir 141 to the supply circuit 78a, as is shown in FIG. 7B.

The solution reservoir 141 of the first bellows pump 73 communicates with the interior of the flexible tube 102 and the resist supply tube 78a. The solution reservoir 141 of the second bellows pump 74 communicates with the interior of the flexible tube 102 and the thinner supply tube 78b. As is shown in FIG. 6, the resist supply circuit 78a and the thinner supply circuit 78b is confluent at the confluence valve 75.

As is shown in FIG. 4, the static mixer 76 and the valve 77 are provided at the tube 88 between the confluence valve 75 and the nozzle 86. It is preferable that the valve 77 is located in a position downstream of the static mixer 76 and as close as possible to the nozzle 86. The length L1 of the static mixer 76 is determined such that its capacity meets the amount (e.g. 5 cc) of the solution discharged from the nozzle 86 at one time. Further, the average inner diameter d3 of the static mixer 76 is about 3.2 mm.

Figure 8A:
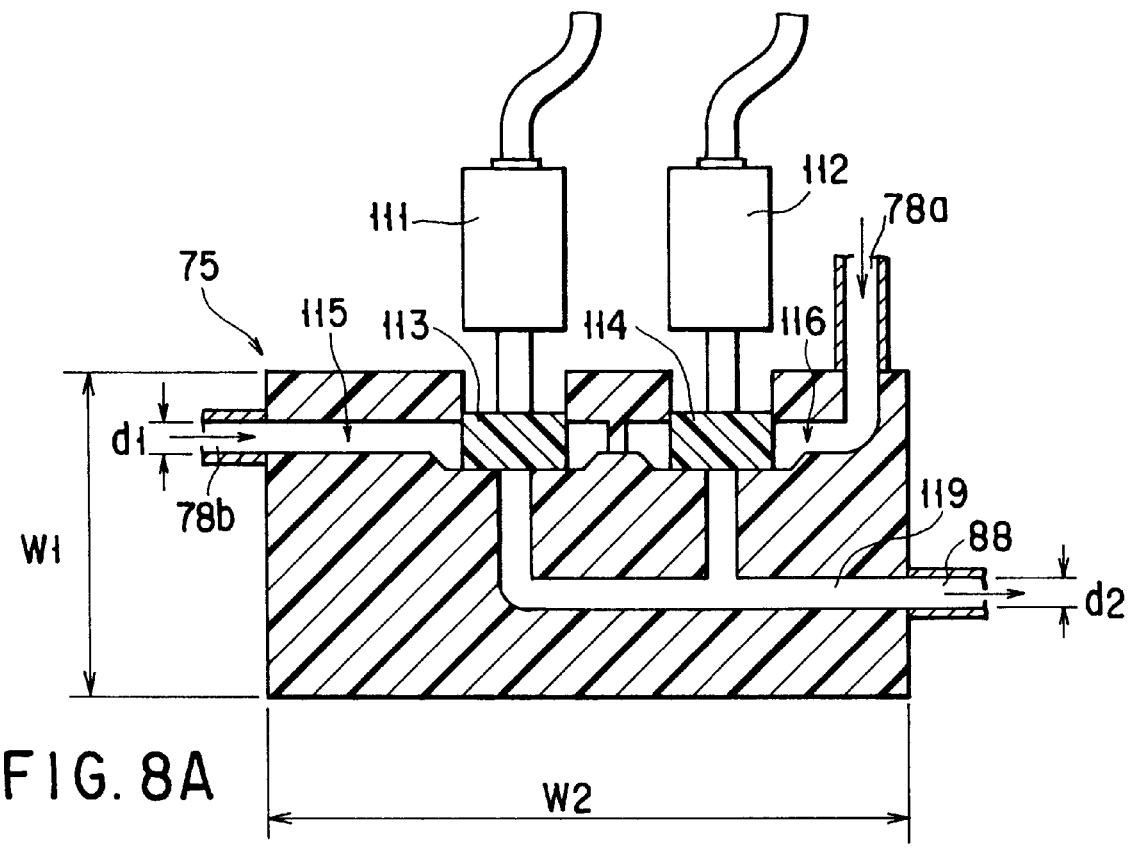
FIGS. 8A and 8B are sectional views, each showing a confluence valve.
Figure 8B:
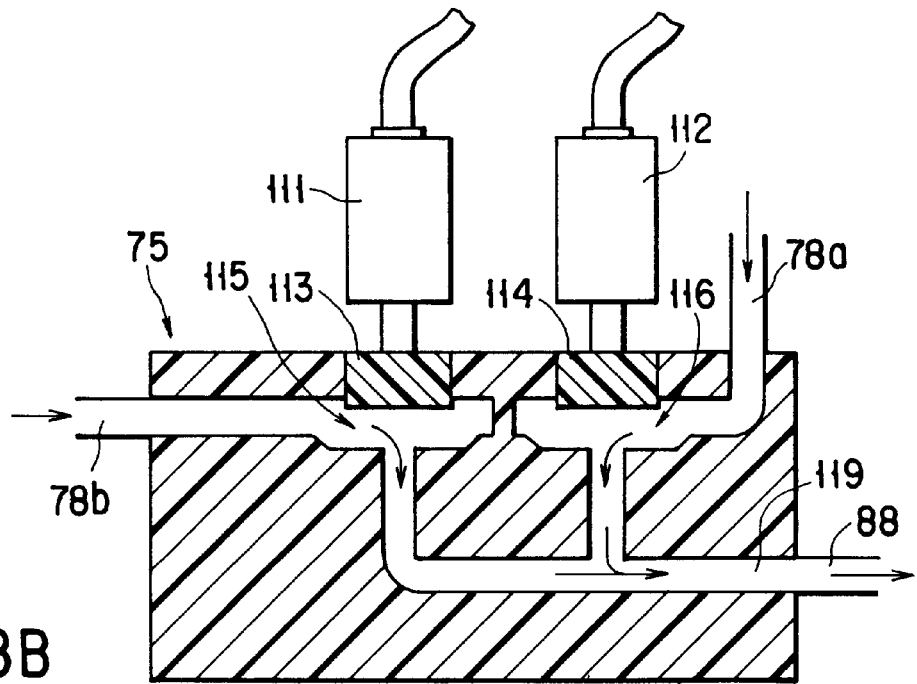

Referring to FIGS. 8A and 8B, the confluence valve 75 will be described.

The confluence valve 75 has first and second introduction passages 115 and 116 and a single discharge passage 119. The first and second introduction passages 115 and 116 communicate with the thinner supply tube 78b and the resist solution supply tube 78a, respectively. A first valve body 113 is rotatably supported by the rod of a first air cylinder 111 for opening and closing the first introduction passage 115. A second valve body 114 is rotatably supported by the rod of a second air cylinder 112 for opening and closing the second introduction passage 116. An opening/closing portion of the downstream valve 77 is substantially the same as that of the confluence valve 75.

The confluence valve 75 has a width W1 of about 30 mm, a height W1 of about 30 mm, and a length W2 of about 50 mm. The first and second introduction passages have an inner diameter d1 of 4.35 mm, and the discharge passage 119 has an inner diameter d2 of 4.35 mm. Each portion of the confluence valve 75 is made of PTFE resin.

When the first and second valve bodies 113 and 114 are separated from their valve seats as shown in FIG. 8A, the resist solution and thinner flow into the discharge passage 119, pass the tube 88 and reach the static mixer 76. The controller 131 operates in synchronism with the on/off operations (i.e. discharging and pumping operations) of each bellows pump 73, 74 to operate each air cylinder 111, 112.

Referring then to the timing chart of FIG. 9, the operation of each element will be described.

FIG. 9(a) shows the operations of the first bellows pump 73 for the resist solution, FIG. 9(b) shows the second bellows pump 74 for thinner, FIG. 9(c) shows the second valve body 114 (for thinner) of the confluence valve 75, FIG. 9(d) shows the first valve body 113 (for the resist solution) of the valve 75, and FIG. 9(e) shows the downstream valve 77, respectively.

The first and second bellows pumps 73 and 74 are simultaneously opened at a time point t1, and closed at a time point t4. The period from t1 to t4 is about 2–3 seconds. The first and second valve bodies 113 and 114 of the confluence valve 75 are simultaneously opened at a time point t3 about 20 ms later than the time point t1, and closed at a time point t6 about 20 ms later than the time point t4. The period from t3 to t6 is about 2–3 seconds. The downstream valve 77 is opened at a time point t2 between the time points t1 and t3, and closed at a time point t5 between the time points t4 and t6.

If the confluence valve 75 is opened at a time point before the time point t1 at which each bellows pump 73, 74 starts to discharge, the remaining solution of the previous wafer treatment cycle may reversedly flow into the pump. To avoid this, it is desirable to set the time point t3, at which the confluence valve 75 is opened, after the time point t1 at which each bellows pump 73, 74 starts to discharge. Further, it is desirable to simultaneously open the valve bodies 113 and 114 of the confluence valve 75. Moreover, when the downstream valve 77 is opened slightly earlier than the valve bodies 113 and 114 of the valve 75, the resist solution and thinner can smoothly flow into the tube 88 and be smoothly mixed in the static mixer 76.

As is shown in FIG. 10, the static mixer 76 has a cylindrical stainless tube 76a and seventy four (for example) baffles 117 contained therein. Each baffle 117 is formed by twisting one side of a square plate by 90° to the right or left as shown in FIGS. 11A and 11B. FIG. 11A shows a baffle twisted to the left, while FIG. 11B shows a baffle twisted to the right. In the static mixer 76, leftward twisted baffles and rightward twisted baffles are arranged alternately. The resist solution and thinner pass the cylindrical tube 76a with their flow directions changed from right to left and from left to right, alternately. As a result, they are mixed efficiently.

It is preferable to set the inner diameter d3 of the cylindrical tube 76a of the static mixer 76 at a value (e.g. a value falling within a range of 2 mm–8 mm) equal to that of a connecting tube. If the inner diameter d3 of the tube 76a is less than 2 mm, the tube 76a is liable to be blocked. If, on the other hand, the inner diameter d3 is more than 8 mm, a great amount of solution must be exhausted when the kind of resist solution or the viscosity of the resist solution is changed, thereby reducing the amount of the used resist solution and thinner. The inner wall of the tube 76a and the surface of each baffle 117 with which the resist/thinner mixture is brought into contact are coated with a film of a high corrosion resistance, such as a tetrafluoroethylene resin film, a nimfluoric plated film, a TiC film, a Tuframe treated film, a white alumite film, etc.

As is shown in FIG. 4, the static mixer 76 has a downstream end thereof higher than an upstream end thereof and inclined at an angle α. Situating the downstream end higher than the upstream end of the static mixture 76 enables easy movement of air to the downstream end and hence easy discharge of it through the nozzle 86.

Moreover, it is desirable to set the inclination angle α of the static mixer 76 not less than 20°. In this case, air can be prevented from remaining in the static mixer 76. In the mixer 76, the multiple baffles 117 interrupt the movement of air toward the downstream side, and therefore air is liable to remain in it, which weakens the force of mixing the resist solution and thinner.

Figure 12:
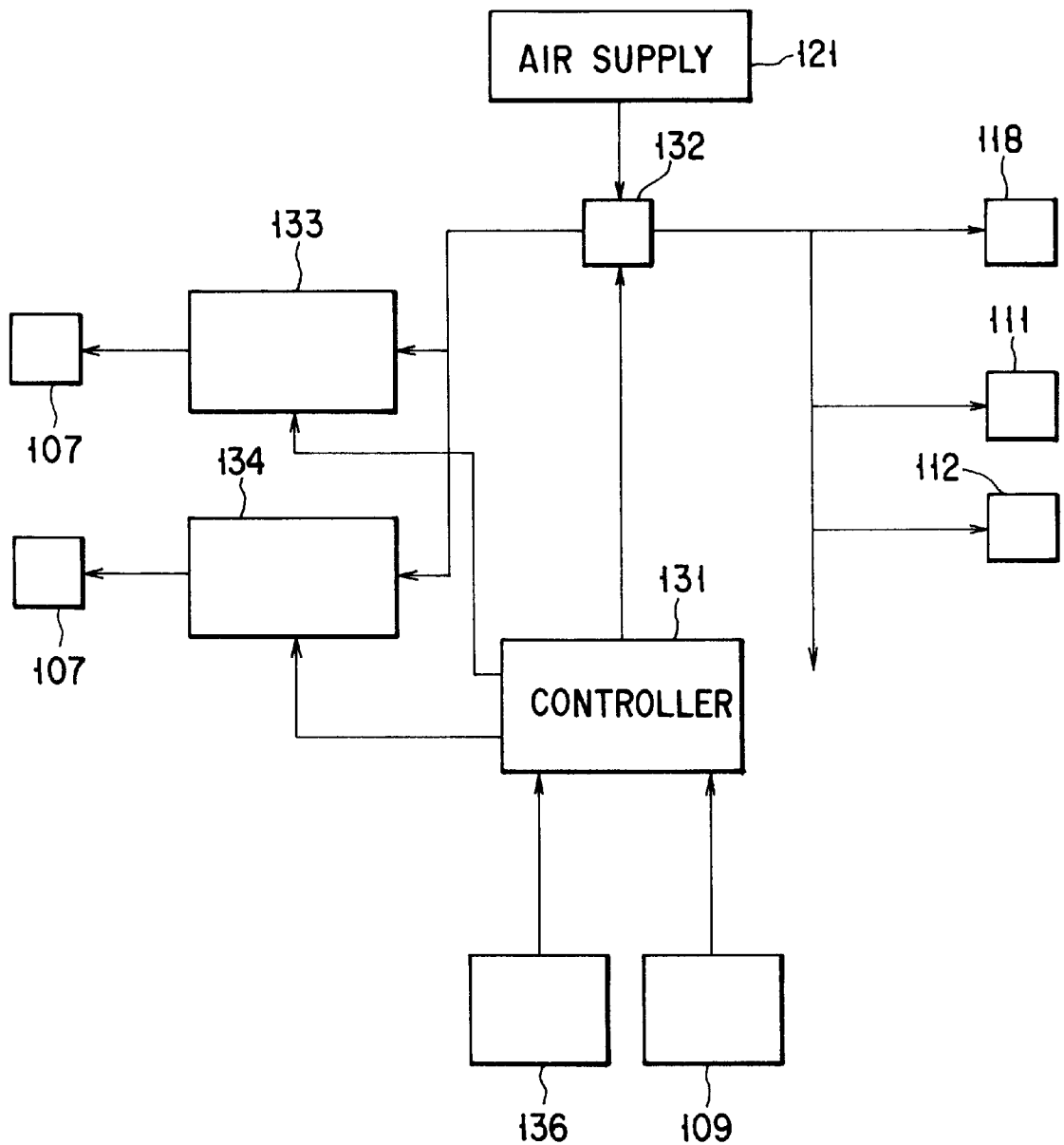
FIG. 12 is a block diagram, showing a control system for controlling the resist/thinner mixer.

Referring to FIG. 12, the control system for the coating apparatus will be described.

The controller 131 controls a main air valve 132 and first and second air flow control sections 133 and 134 on the basis of detection signals output from the two sensor light receiving sections 109 and 136. The main air valve 132 is an electromagnetic valve connected to an air supply 121. The first and second air flow control sections 133 and 134 control a cylinder 107 incorporated in the resist solution bellows pump 73, and a cylinder 107 incorporated in the thinner bellows pump 74, respectively. The main air valve 132 is connected to the air cylinders 111 and 112, and an air cylinder 118 for opening and closing the valve body (not shown) of the downstream valve 77.

The controller 131 supplies a signal indicative of a control amount set by the operator, to the two air flow control sections 133 and 134 for the bellows pumps 73 and 74. The discharge rate of each bellows pump 73, 74 is controlled by adjusting the air supply amount of the air cylinder 107.

Since the mixture ratio of the resist solution and thinner can be set easily by controlling the discharge rate of each bellows pump 73, 74, the viscosity of the resist solution to be coated on the wafer W can be adjusted easily.

In addition, upon receiving the signal output from any one of the optical sensors 135 and 136, which indicates termination of the discharge step of a corresponding one of the bellows pumps 73 and 74, the controller 131 closes the main air valve 132 and turns off the air cylinders 107, 111, 112 and 118 of the confluence valve 75, the discharge valve 77 and the bellows pumps 73 and 74.

The confluence valve 75, the discharge valve 77 and the bellows pumps 73 and 74 are turned on and off at slightly different points of time. The slight differences in time can be also adjusted by changing the lengths of air supply tubes which connect the main air valve 132 to the air cylinders 107, 111, 112 and 118. If as described above, the time point t3 is set earlier than the time point t1, the remaining solution of the previous wafer treatment cycle may reversedly flow into the confluence valve 75. To avoid this, the confluence valve 75 is opened 20 ms after the start of the compression step of each bellows pump 73, 74. Further, when each bellows pump 73, 74 enters its contraction step, it is preferable to close the downstream valve 77 before the confluence valve 75, i.e. to set the time point t5 earlier than the time point t6, in order to prevent the resist solution from dripping from the nozzle 86 onto the wafer W.

The operation of the above-described coating apparatus will now be described.

The operator beforehand inputs, to the controller 131, data for setting the viscosity of each resist solution to be coated on the wafer W. The set viscosities are obtained from a table which shows the relationship between the viscosity of each resist solution and the stroke rate (i.e. the discharge rate) of each bellows pump 73, 74 at a resist coating temperature. The supply amount of a resist/thinner mixture in each wafer treatment cycle is determined on the basis of position detection data output from the sensors 108, 109, 135 and 136. For example, 0.5 cc of thinner is added to first 1 cc of a resist solution discharged from the nozzle 86. This addition manner of thinner can reduce the amount of the resist solution required in one wafer treatment cycle.

Upon receiving viscosity setting data from the operator, the controller 131 reads, from the table, data concerning a corresponding stroke rate of each bellows pump 73, 74, for example, and supplies a signal indicative of a control amount corresponding to a desired stroke rate, to each of the two air flow control mechanisms 133 and 134 for controlling the air cylinders of the bellows pumps 73 and 74, respectively. As a result, the stroke rate, i.e. the discharge rate, of each bellows pump 73, 74 is set for obtaining a desired resist solution viscosity.

After completion of the setting, the controller 131 opens the main air valve 132. When the main air valve 132 is opened, the air supply 121 supplies air to the air cylinders 107, 111, 112, 118 of the confluence valve 75, the discharge valve 77 and the bellows pumps 73 and 74, thereby simultaneously compressing the bellows pumps 73 and 74 and opening the confluence valve 75 and the discharge valve 77.

Accordingly, the resist solution and thinner pumped from the resist tank 71 and the thinner tank 72 to the bellows pumps 73 and 74 join together in the confluence valve 75, and flow into the static mixer 76. They are mixed in the mixer 76, and discharged through the nozzle 86 via the tube 88.

When the discharge step of one of the bellows pumps 73 and 74 is terminated, the sensors 108, 109, 135 and 136 supply a position detection signal to the controller 131. The controller 131 in turn closes the main air valve 132. When the main air valve 132 is closed, the compression (discharge) step of each bellows pump 73, 74 terminates and shifts to the expansion (pumping) step caused by the elastic restoring force of the flexible tube 102. Simultaneously, the confluence valve 75 and the discharge valve 77 are closed. Thus, the supply of the resist solution to the wafer W is completed.

In the above-described coating apparatus, a resist solution is mixed with thinner to be thinned to a desired viscosity, which means that the resist solution can be made to have any viscosity by preparing only a single resist solution tank and thinner tank. Accordingly, the coating apparatus of the embodiment can promptly and flexibly deal with a demand for changing the thickness of a resist film formed on a wafer. It is a matter of course that the apparatus can easily deal with changes in resist film thickness due to differences in daily ambient conditions.

When in the embodiment, the viscosity of the resist solution is changed to meet the demand for changing the thickness of a resist film to be formed on a wafer, all resist solution which was prepared before the viscosity change and still remains in a tube incorporated in the resist supply circuit is exhausted. Specifically, all the remaining resist solution is exhausted by, for example, moving the resist nozzle 86 to its retreat position, and continuously supplying the mixture of the resist solution and thinner. The mixture is supplied in an amount which exceeds the capacity of the pipe line located downstream of the pumps 73 and 74, and is prepared according to the discharge amount setting conditions of the pumps 73 and 74 set after the viscosity change, thereby exhausting the remaining solution in the pipe line through the nozzle 86. As a result, a resist solution of a viscosity different from a target value is prevented from being applied to the wafer W, which means that a resist film of a desired thickness can be formed even on a wafer W first fed after the film thickness change.

Referring to FIGS. 13, 14A, 14B and 15, a coating apparatus according to a second embodiment of the invention will be described. Concerning the elements common to the first and second embodiments, no explanations are given.

The coating apparatus of the second embodiment includes a number n of resist tanks 71*l*–71*n* which contain resist solutions of different compositions. The resist tank 71*l*–71*n* contain a first resist solution R1—an n-th resist solution Rn, respectively. The first through n-th resist solutions R*l*–R*n* have different compositions such as phenol-based novolak resin resist, a chemical amplification type resist, etc., and have respective predetermined densities (viscosities). Bellows pumps 73*l*–73*n* are provided for resist supply circuits for the resist tanks 71*l*–71*n*, respectively. Moreover, a single thinner tank 721 is commonly used in the coating apparatus of the second embodiment. Specifically, a thinner supply tube 78b for the thinner tank 721 and resist supply tubes 78a–78n join together in a confluence valve 751. A static mixer 761, a discharge valve 771 and a nozzle 861 are provided across a tube 88 provided downstream of the confluence valve 751. The static mixer 761 and the discharge valve 771 are substantially identical to those employed in the first embodiment.

Figure 14A:
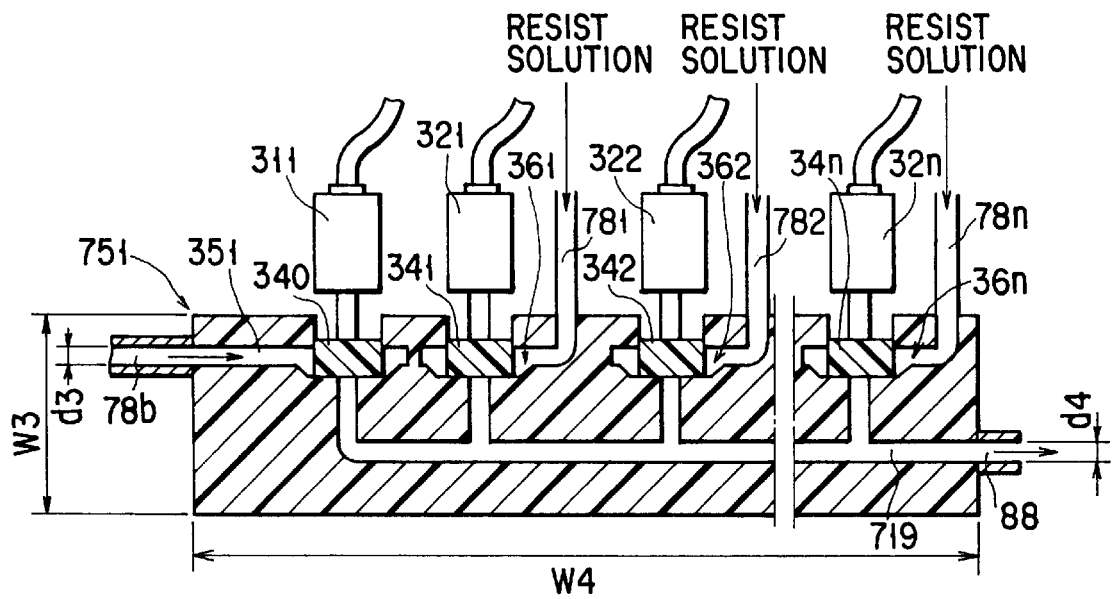
FIGS. 14A and 14B are sectional views, each showing a confluence valve according to a further embodiment of the invention.
Figure 14B:
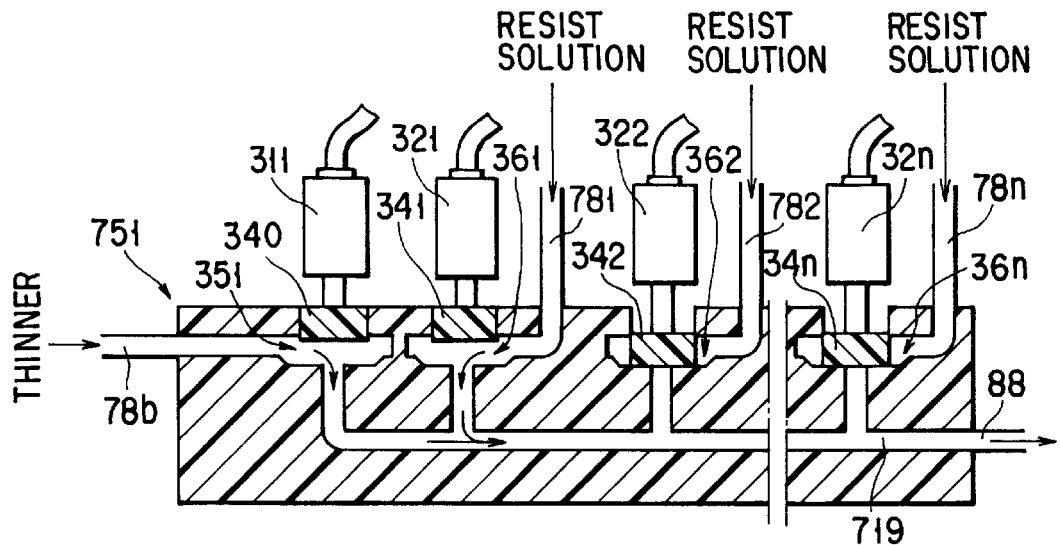

Referring then to FIGS. 14A and 14B, the confluence valve 751 will be described in detail. The confluence valve 751 has first through n-th resist introduction passages 36l–36n, a single thinner introduction passage 351, and a single discharge passage 719. The introduction passages 36l–36n join the discharge passage 719 in the confluence valve 751, and the discharge passage 719 communicates with the nozzle 816 via the tube 88. The first resist introduction passage 361 communicates with the first resist tank 711 via a supply tube 781, and the second resist introduction passage 362 communicates with the second resist tank 712 via a supply tube 782. Similarly, an n-th resist introduction passage 36n communicates with an n-th resist tank 71n via a supply tube 78n. Further, the thinner introduction passage 351 communicates with the thinner tank 721 via the supply tube 78b.

Figure 15:
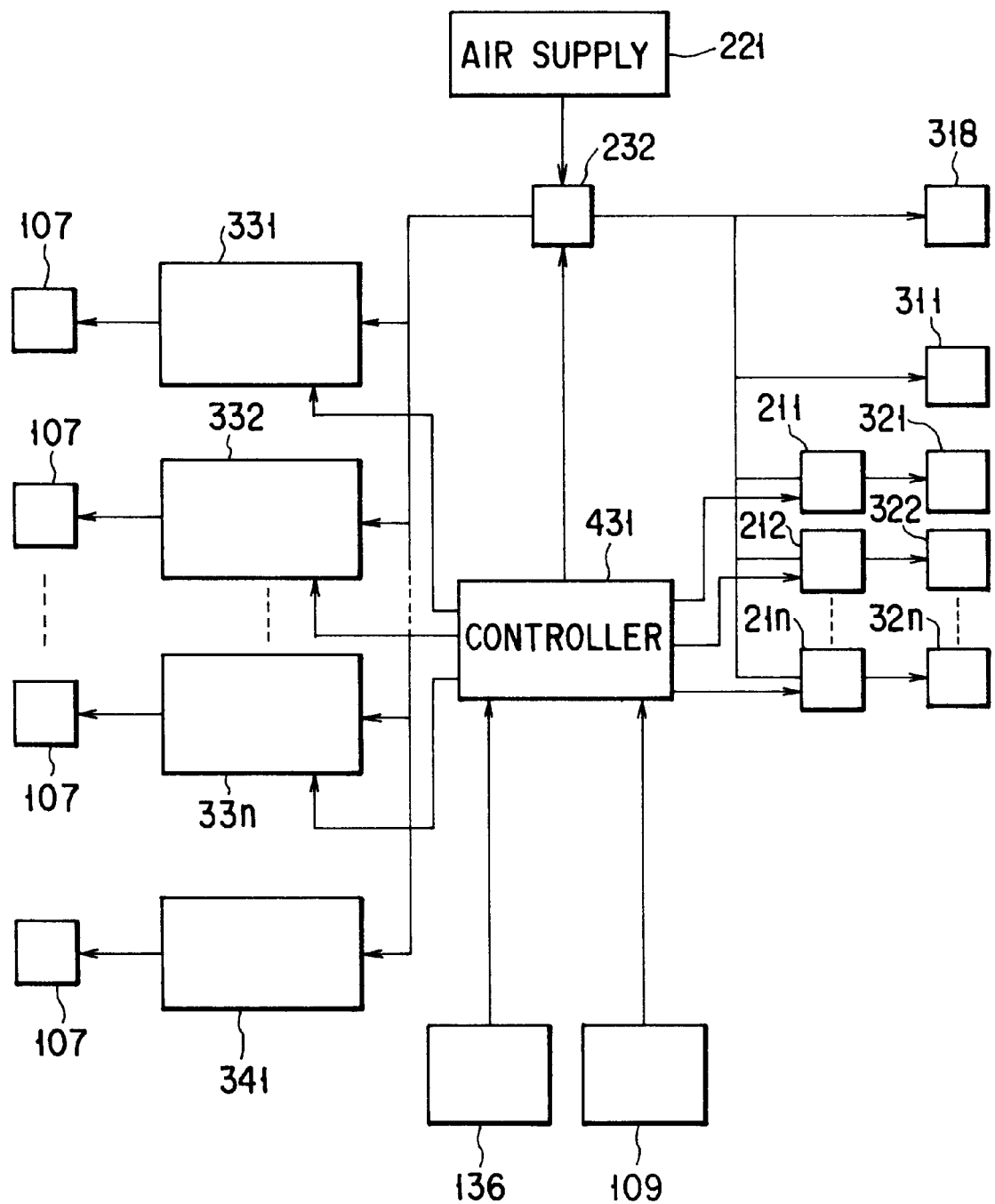
FIG. 15 is a block diagram, showing a control system for a resist/thinner mixer according to a yet another embodiment of the invention.

A first valve body 340 is movably supported by the rod of a first air cylinder 311, and disposed to open and close the thinner introduction passage 351. A second valve body 341 is movably supported by the rod of a second air cylinder 321, and disposed to open and close the first resist introduction passage 361. A third valve body 341 is movably supported by the rod of a third air cylinder 322, and disposed to open and close the second resist introduction passage 362. An (n+1)th valve body 34n is movably supported by the rod of an (n+1)th air cylinder 32n, and disposed to open and close an n-th resist introduction passage 36n. An opening/closing section for the downstream discharge valve 771 is substantially identical to that of the confluence valve 751, and includes an air cylinder 318 as shown in FIG. 15. The valve bodies 34a–34n for opening and closing the resist solution introduction passages 36l–36n are kept closed except for one which corresponds to a resist solution selected by the operator.

The confluence valve 751 has a width W3 of about 30 mm, a height W3 of about 30 mm. When the number of the introduction passages is ten, the confluence value 751 has a length W4 of about 330 mm. The thinner introduction passage 351 and the first through n-th introduction passages 36l–36n have an inner diameter d3 of 4.35 mm, and the discharge passage 719 has an inner diameter d4 of 4.35 mm. Each portion of the confluence valve 751 is made of PTFE resin.

Referring to FIG. 15, a control system incorporated in the apparatus of the second embodiment will be described.

A controller 431 controls a main air valve 232 and a number n of air flow control sections 33l–33n on the basis of detection signals output from two sensor light receiving sections 109 and 136. The main air valve 232 is an electromagnetic valve connected to an air supply 221. The first and second air flow control sections 331 and 332 control a cylinder 107 incorporated in a bellows pump 731 for the first resist solution R1, and a cylinder 107 incorporated in a bellows pump 732 for the second resist solution R2, respectively. An n-th air flow control section 33n controls a cylinder 107 incorporated in a bellows pump 73n for an n-th resist solution Rn. A last air flow control section 341 controls a cylinder 107 incorporated in a thinner bellows pump 741.

The main air valve 232 is connected to the air cylinders 111 and 112, and an air cylinder 118 for opening and closing the valve body (not shown) of the downstream valve 77.

The controller 131 supplies a signal indicative of a control amount set by the operator, to the two air flow control sections 133 and 134 for the bellows pumps 73 and 74. The discharge rate of each bellows pump 73, 74 is controlled by adjusting the air supply amount of the air cylinder 107.

Since the mixture ratio of the resist solution and thinner can be set easily by controlling the discharge rate of each bellows pump 73, 74, the viscosity of the resist solution to be coated on the wafer W can be adjusted easily.

In addition, upon receiving the signal output from any one of the optical sensors 135 and 136, which indicates termination of the discharge step of a corresponding one of the bellows pumps 73 and 74, the controller 131 closes the main air valve 132 and turns off the air cylinders 107, 111, 112 and 118 of the confluence valve 75, the discharge valve 77 and the bellows pumps 73 and 74. The air cylinder 318 is used to open and close the valve body (not shown) of the downstream valve 771.

The air cylinders 32l–32n for resist solution supply incorporated in the confluence valve 751 are connected to the main air valve 232 via electromagnetic valves 21l–21n, respectively. The controller 431 selects that one of the resist solutions Rl–Rn which is to be coated on a wafer W by controlling the operations of the electromagnetic valves 21l–21n. Specifically, the controller 431 opens only that one of the electromagnetic valves which corresponds to the selected resist solution, and closes the other electromagnetic valves. Further, the controller 431 controls the main air valve 232 so that air can be supplied only to the air cylinder 107 of a bellows pump dedicated to the selected resist solution, and also controls each air flow control mechanism 33l–33n. The viscosity of each resist solution is adjusted in the same manner as in the first embodiment. When the kind of resist solution to be used is changed from one to another, all resist solution remaining in the resist solution supply tube 88 downstream of the confluence valve 751 is exhausted.

Although in the above-described embodiments, the invention is applied to an apparatus for coating a resist solution on a semiconductor wafer, it is also applicable to an apparatus for coating the resist solution on a substrate other than the semiconductor wafer, e.g. an LCD substrate.

Since in the invention, the viscosity of a resist solution can be adjusted to a target value immediately before it is coated on a substrate, a uniform resist film of a target thickness can be coated thereon even if the resist solution and its solvent are liable to separate.

Further, since in the invention, a resist solution of a target viscosity can be prepared at the actual coating stage, a change in treatment condition such as film thickness can be promptly dealt with. Also, in the invention, it is not necessary to prepare many resist solution supplies for supplying resist solutions of the same kind but of different viscosities. Only one resist solution supply enables a resist solution of one kind to have different viscosities, which enables the coating apparatus to be made compact. Moreover, the invention is free from variations in resist film thickness due to differences in daily ambient conditions.

In addition, in the invention, the on/off control of supply of a treatment solution and a solvent to mixer means by treatment solution/solvent supply means is performed in synchronism with the opening/closing control of valves provided across solution supply tubes downstream of the mixer means, thereby effectively preventing reverse flow of the treatment solution and the solvent.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

We claim:

1. A coating apparatus configured to coat a substrate with a treatment solution, comprising:

a substrate holding member configured to hold the substrate;

a treatment solution supply having a plurality of treatment solution tanks which contain treatment solutions of different compositions;

a solvent supply which contains a solvent;

a confluence valve coupled to the solvent supply and the treatment solution supply, said confluence valve including:

a main treatment solution passage, switch means for selectively switching a transfer of a treatment solution from said plurality of treatment solution tanks to said main treatment solution passage, a solvent passage coupled to the solvent tank, a valve seat provided in the solvent passage, a first valve body for opening and closing the solvent passage, and a first valve cylinder for bringing the first valve body into and out of contact with the valve seat;

first pump means for supplying the treatment solution from the treatment solution supply to the confluence valve, said first pump means including a first flexible tube coupled to a treatment solution reservoir, and a first pump cylinder means for reciprocating the flexible tube;

second pump means for supplying the solvent from the solvent supply to the confluence valve, the second pump means including a second flexible tube coupled to a solvent reservoir, and a second pump cylinder means for reciprocating the flexible tube;

a mixer provided downstream of the confluence valve and configured to mix the treatment solution and the solvent supplied from the confluence valve;

nozzle means coupled to said mixer and having a solution discharge portion for applying a solution from the mixer, to the substrate held by the substrate holding member;

a discharge valve located downstream of the mixer and in the vicinity of the nozzle means and configured to permit and interrupt a flow of a solution from the mixer to the nozzle means;

a sensor means for sensing an amount of displacement of said flexible tubes; and control means for controlling said first and second cylinder means on the basis of a detection signal from said sensor means thereby controlling the first and second pump means to adjust a mixture ratio of the treatment solution to be supplied from the treatment solution supply to the confluence valve, to the solvent supplied from the solvent supply to the confluence valve.

2. The coating apparatus according to claim 1, wherein the switch means includes a plurality of treatment solution passages each communicating with a corresponding one of the treatment solution tanks, valve seats each provided in a corresponding one of the treatment solution passages, second valve bodies each for opening and closing a corresponding one of the solution treatment passages, and second valve cylinders each for bringing a corresponding one of the second valve bodies into and out of contact with a corresponding one of the valve seats.

3. The coating apparatus according to claim 2, wherein the control means stops the supply of the treatment solution and the solvent when the sensor senses termination of an operation of the first and second pump cylinder means.

4. The coating apparatus according to claim 1, wherein the control means individually controls a supply rate of the primary treatment solution from the treatment solution supply, and a supply rate of the solvent from the solvent supply.

5. The coating apparatus according to claim 1, further comprising remaining solution exhausting means for exhausting a solution remaining between the confluence valve and the solution discharge portion before switching the treatment solution tanks, after the switch means switches the treatment solution tanks.

6. The coating apparatus according to claim 1, further comprising remaining solution exhausting means for exhausting a solution remaining between the confluence valve and the solution discharge portion before changing the mixture ratio of the treatment solution to the solvent, after the control means changes the mixture ratio.

7. The coating apparatus according to claim 1, wherein the mixer is a static mixer having a plurality of baffles linearly arranged across a solution passage for mixing the treatment solution and the solvent.

8. The coating apparatus according to claim 7, wherein each of the baffles of the static mixer is formed by leftward or rightward twisting one side of a square plate by 90°, and leftward twisted baffles and rightward twisted baffles are arranged alternately in a solution passage.

9. The coating apparatus according to claim 7, wherein the static mixer has a downstream end thereof located at a higher level than an upstream end thereof.

10. The coating apparatus according to claim 7, wherein the static mixer has a solution passage thereof inclined by 20° or more with respect to a horizontal plane.

11. The coating apparatus according to claim 1, wherein the confluence valve has a plurality of solution introduction passages, and a single solution discharge passage.

12. The coating apparatus according to claim 11, wherein one of the solution introduction passages communicates with the solvent supply, and the other introduction passages communicate with the primary treatment solution supply.

13. The coating apparatus according to claim 2, further comprising a main air valve adapted to adjust one of a flow and pressure of air to be supplied to the first and second valve cylinders, and the first and second pump cylinder means, the main air valve being controlled by the control means.

14. The coating apparatus according to claim 1, wherein the substrate is a semiconductor wafer, and the substrate holding member is a spin chuck for rotating the semiconductor wafer held thereon.

15. The coating apparatus according to claim 1, wherein the primary treatment solution contained in the treatment solution supply is a resist solution of a predetermined concentration mixed with a predetermined amount of a solvent.

16. The coating apparatus according to claim 1, wherein at least those portions of the confluence valve and the mixer, which come in contact with a liquid, comprise at least one of a coating with a tetrafluoroethylene resin film (TiC), and a metal or alloy.

* * * * *